United States Patent
Shindo

(10) Patent No.: US 7,959,782 B2
(45) Date of Patent: Jun. 14, 2011

(54) METHOD OF MANUFACTURING A NI-PT ALLOY

(75) Inventor: Yuichiro Shindo, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 12/957,013

(22) Filed: Nov. 30, 2010

(65) Prior Publication Data

US 2011/0068014 A1 Mar. 24, 2011

Related U.S. Application Data

(62) Division of application No. 10/596,671, filed as application No. PCT/JP2005/001813 on Feb. 8, 2005.

(30) Foreign Application Priority Data

Mar. 1, 2004 (JP) .................................. 2004-056097

(51) Int. Cl.
*C23C 28/02* (2006.01)
*C25D 5/48* (2006.01)
*C25C 1/24* (2006.01)
*C22C 5/04* (2006.01)
*C01B 31/24* (2006.01)

(52) U.S. Cl. ........ 205/191; 205/228; 205/557; 420/456; 423/419.1

(58) Field of Classification Search .................. 148/426; 420/468, 456; 205/191, 228, 557; 423/419.1
See application file for complete search history.

(56) References Cited

U.S. PATENT DOCUMENTS

| 2,269,497 | A | 1/1942 | Vilensky |
| 5,188,713 | A | 2/1993 | O'Brien et al. |
| 6,267,827 | B1 | 7/2001 | Shindo et al. |
| 6,485,542 | B2 | 11/2002 | Shindo et al. |
| 6,531,396 | B1 | 3/2003 | Chi et al. |
| 7,435,325 | B2 | 10/2008 | Shindo et al. |
| 7,605,481 | B2 | 10/2009 | Yamakoshi et al. |
| 7,618,505 | B2 | 11/2009 | Yamakoshi et al. |
| 7,740,718 | B2 | 6/2010 | Yamakoshi et al. |
| 2004/0256035 | A1 | 12/2004 | Yamakoshi et al. |
| 2006/0037680 | A1 | 2/2006 | Yamakoshi |
| 2006/0292028 | A1 | 12/2006 | Shindo et al. |
| 2007/0098590 | A1 | 5/2007 | Shindo |
| 2009/0004498 | A1 | 1/2009 | Shindo et al. |
| 2010/0242674 | A1 | 9/2010 | Shindo et al. |

FOREIGN PATENT DOCUMENTS

| JP | 63-033563 A | 2/1988 |
| JP | 05-043921 A | 2/1993 |
| JP | 2003-213405 A | 7/2003 |
| WO | 03/062488 A1 | 7/2003 |

*Primary Examiner* — Jessee R. Roe
(74) *Attorney, Agent, or Firm* — Howson & Howson LLP

(57) ABSTRACT

A Ni—Pt alloy and target superior in workability containing 0.1 to 20 wt % Pt and having a Vickers hardness of 40 to 90. A method of manufacturing the Ni—Pt alloy comprises steps of subjecting a raw material Ni having a purity of 3N level to electrochemical dissolution, neutralizing the electrolytically leached solution with ammonia, removing impurities through filtration with activated carbon, blowing carbon dioxide into the resultant solution to form nickel carbonate, exposing the resultant product to a reducing atmosphere to prepare high purity Ni powder, leaching a raw material Pt having a purity of 3N level with acid, subjecting the leached solution to electrolysis to prepare high purity electrodeposited Pt, and dissolving the resultant high purity Ni powder and high purity electrodeposited Pt. The method enables rolling of the Ni—Pt alloy ingot upon reducing the hardness thereof, which results in the stable and efficient manufacture of a rolled target.

7 Claims, No Drawings

METHOD OF MANUFACTURING A NI-PT ALLOY

CROSS REFERENCE TO RELATED APPLICATIONS

This application is a divisional of co-pending U.S. application Ser. No. 10/596,671 which is the National Stage of International Application No. PCT/JP05/01813, filed Feb. 8, 2005, which claims the benefit under 35 USC §119 of Japanese Application No. 2004-056097, filed Mar. 1, 2004.

BACKGROUND OF THE INVENTION

The present invention relates to a Ni—Pt alloy superior in workability, a sputtering target manufacturing by rolling a Ni—Pt alloy ingot, and a manufacturing method of such Ni—Pt alloy and Ni—Pt alloy target.

Ni—Pt is used as a sputtering target for semiconductor devices, and this Ni—Pt target was conventionally manufactured with a powder metallurgy process. In other words, the target was manufactured by sintering Ni powder and Pt powder, or by sintering Ni—Pt alloy powder.

Since it is impossible for a sintered product to become a 100% high density product, it is undeniable that such sintered product is inferior in terms of density in comparison to a target manufactured via melting, casting and rolling.

Therefore, gas components easily get mixed into the target, and not only does this reduce purity, it causes abnormal electrical discharge during sputtering, induces the generation of particles, and deteriorates the deposition characteristics.

Meanwhile, a Ni—Pt product formed via melting and casting has a problem in that it is extremely hard and brittle. As a result, when a Ni—Pt ingot is rolled, there is a problem in that grain boundary fractures occur, and it is not possible to manufacture a flat and even planar target. This is the reason targets were manufactured with the powder metallurgy process as described above.

In light of the foregoing circumstances, a Ni—Pt target formed via melting and casting, and which is free from cracks, has been proposed. For instance, refer to Japanese Patent Laid-Open Publication No. S63-33563.

Japanese Patent Laid-Open Publication No. S63-33563 considered the cause of fractures to be the coarsened crystal grains in the target and, in order to obtain fine crystal grains, attempted to inhibit the coarsening of crystals by preparing a mold with large heat capacity or a water-cooled mold, and performing rapid quenching by inhibiting the temperature rise of the mold.

Nevertheless, with Japanese Patent Laid-Open Publication No. S63-33563, there is a drawback in that large equipment is necessary for preparing a mold with large heat capacity or a water-cooled mold, and there is a problem in that it is difficult to inhibit the coarsening of crystals unless the cooling speed is considerably fast.

Further, the crystals that come in contact with the mold are fine, and become coarse as they draw away from such mold. Thus, there is a problem in that it is difficult to obtain a uniform crystal structure, and it is therefore not possible to manufacture a target having a uniform structure or that is stable.

SUMMARY OF THE INVENTION

An object of the present invention is to provide technology capable of rolling a Ni—Pt alloy ingot upon reducing the hardness thereof, and manufacturing a rolled target stably and efficiently.

In order to overcome the foregoing problems, the present inventors discovered that by increasing the purity of the Ni—Pt alloy, it is possible to significantly reduce the hardness of the Ni—Pt alloy ingot.

Based on the foregoing discovery, the present invention provides a Ni—Pt alloy superior in workability containing Pt in a content of 0.1 to 20 wt % and having a Vickers hardness of 40 to 90, and a target comprising the Ni—Pt alloy. The Ni—Pt alloy and Ni—Pt alloy target can have a purity of 99.99% or higher.

Further, the present invention also provides a method of manufacturing a Ni—Pt alloy superior in workability comprising a step of subjecting a raw material Ni having a purity of 3N level to electrochemical dissolution, a step of neutralizing the electrolytically leached solution with ammonia, a step of removing impurities by filtering the neutralized solution with activated carbon, a step of blowing carbon dioxide into the resultant solution to form nickel carbonate and exposing the resultant product to a reducing atmosphere to prepare high purity Ni powder, a step of leaching a raw material Pt having a purity of 3N level with acid, a step of subjecting the leached solution to electrolysis to prepare high purity electrodeposited Pt, and a step of dissolving the resultant high purity Ni powder and high purity electrodeposited Pt. The method of manufacturing a Ni—Pt alloy can produce a Ni—Pt alloy having a purity of 99.99% or higher superior in workability and having Pt in a content of 0.1 to 20 wt % and a Vickers hardness of 40 to 90.

Further, the present invention also provides a method of manufacturing a Ni—Pt alloy target from a dissolved Ni—Pt alloy ingot manufactured as described above.

As a result, the present invention is able to easily perform cool rolling to a dissolved Ni—Pt alloy ingot without requiring any equipment, such as preparing a mold with large heat capacity or a water-cooled mold, for accelerating the cooling speed in order to inhibit the coarsening of crystals, and yields a superior effect in that it is possible to improve the quality of the Ni—Pt alloy deposition by reducing impurities contained in the Ni—Pt alloy target and realizing high purification.

Further, in addition to being able to prevent the generation of fractures and cracks in the target, a significant effect is yielded in that the generation of particles which often occurred in conventional sintered targets and resulted from the abnormal electrical discharge of sputtering can be inhibited.

DETAILED DESCRIPTION OF THE INVENTION

The present invention can be applied to a Ni—Pt alloy containing Pt in a content of 0.1 to 20 wt %. This component composition is required in the deposition of a Ni—Pt alloy material of semiconductor devices, and is also a composition range of the Ni—Pt alloy or target of the present invention capable of reducing the hardness. The Vickers hardness obtained by the Ni—Pt alloy of the present invention is 40 to 90.

When the Pt content contained in Ni increases, the hardness (Vickers Hv) also increases. This also has a significant influence on the amount of impurities. At 3N level, when the Pt content contained in Ni increases, the hardness increases drastically, and reaches approximately Hv 130 in the vicinity of Ni-20 wt % Pt.

When an ingot is rolled under this kind of circumstance where the hardness is increased, fractures arise at the grain boundary as a matter of course.

Meanwhile, with the high purity Ni—Pt alloy of the present invention, although the hardness gradually increases from Pt 0.1 wt % to 20 wt %, the Vickers hardness is within the range of 40 to 90, and is within a range where cold rolling can be performed. This is a significant feature of the present invention.

If the hardness is less than Pt 0.1 wt %, sufficient characteristics as a Ni—Pt alloy cannot be obtained, and if the hardness exceeds Pt 20 wt %, as described above, the target becomes too hard and difficult to process. Thus, the Pt content is set to be 0.1 to 20 wt %.

As a result, in addition to being able to prevent the generation of fractures and cracks in the target, a significant effect is yielded in that the generation of particles which often occurred in conventional sintered targets and resulted from the abnormal electrical discharge of sputtering can be inhibited.

The Ni—Pt alloy and Ni—Pt alloy target of the present invention have a purity of 99.99% or higher. As a result, the Vickers hardness is within the range of 40 to 90, and is within a range where cold rolling can be performed.

The manufacturing method of this kind of Ni—Pt alloy superior in workability is explained; as for a Ni raw material, foremost, a raw material Ni having a purity of 3N level is subject to electrochemical dissolution, the electrolytically leached solution is thereafter neutralized with ammonia, and the neutralized solution is filtered with activated carbon to remove impurities.

Next, carbon dioxide is blown into this resultant solution to obtain nickel carbonate, and this is subject to reducing atmosphere to manufacture high purity Ni powder.

Meanwhile, as for Pt raw material, a raw material Pt having a purity of 3N level is leached with acid, and this leached solution is subject to electrolysis to manufacture high purity electrodeposited Pt.

Next, the high purity Ni powder and high purity electrodeposited Pt obtained above are dissolved. The obtained Ni—Pt alloy has a purity of 99.99% (4N) or higher.

Further, the Ni—Pt alloy ingot obtained via melting and casting as described above has a Pt content of 0.1 to 20 wt % and a Vickers hardness of 40 to 90. Also as described above, this ingot is superior in workability.

As a result of performing cold rolling to this dissolved Ni—Pt alloy ingot manufactured as described above, it is possible to easily manufacture a Ni—Pt alloy target.

Thus, in addition to being able to prevent the generation of fractures and cracks in the target, a significant effect is yielded in that the generation of particles which often occurred in conventional sintered targets and resulted from the abnormal electrical discharge of sputtering can be inhibited.

EXAMPLES

Examples of the present invention are now explained. These Examples are merely illustrative, and the present invention shall in no way be limited thereby. In other words, the present invention shall only be limited by the scope of the present invention, and shall include the various modifications other than the Examples of this invention.

Example 1

10 kg of 3N level Ni raw material shown in Table 1 was used as the anode, and this was subject to electrolytic leaching with hydrochloric acid solution. At the point when it became 100 g/L, the resultant solution was neutralized with ammonia, and pH was set to 8. This resultant solution was filtered by adding 10 g/L of activated carbon to remove impurities.

Next, carbon dioxide was blown into this resultant solution to obtain nickel carbonate. The resultant solution was subject to heat treatment at a temperature of 1200° C. under $H_2$ atmosphere to obtain 8 kg of high purity Ni powder.

Meanwhile, 5 kg of 3N level Pt was used and dissolved in royal water. The resultant solution was made to be a pH 2 level, and this was subject to electrolytic winning to obtain high purity electrodeposited Pt. Carbon was used as the anode during electrolytic winning.

The high purity Ni powder and high purity electrodeposited Pt obtained as described above were dissolved under a vacuum where the degree of vacuum was $10^{-4}$ Torr to obtain high purity Ni-20 wt % Pt alloy. The hardness of this alloy was Hv 80. This alloy was rolled at room temperature to obtain a target.

There were no generation of cracks or fractures in the target, and rolling could be performed easily. The results are shown in Table 1.

TABLE 1

| (units are wtppm) | | | | | |
|---|---|---|---|---|---|
| | Raw Material Ni | Raw Material Pt | High Purity Ni | High Purity Pt | Example 1 | Comparative Example 1 |
| Fe | 110 | 10 | 2.1 | 1.0 | 1.7 | 90 |
| Cr | 50 | 2 | 0.6 | 0.5 | 0.6 | 44 |
| Co | 60 | 5 | 0.5 | 0.2 | 0.4 | 49 |
| Cu | 30 | 4 | 0.1 | 0.1 | 0.1 | 25 |
| Al | 10 | 8 | 0.1 | 0.1 | 0.1 | 9.5 |
| O | 150 | 70 | 20 | <10 | 10 | 130 |
| C | 80 | 20 | 10 | <10 | 10 | 70 |
| N | 30 | 10 | <10 | <10 | <10 | 25 |
| Hardness | 100 | 40 | 70 | 30 | 80 | 110 |
| Plastic Workability at Room Temperature | Fair | Good | Good | Excellent | Excellent | Inferior |

Example 2

As with Example 1, high purity Ni-0.5 wt % Pt alloy was prepared. The hardness of this alloy was Hv 45. This alloy was rolled at room temperature to obtain a target. There were no generation of cracks or fractures in the target, and rolling could be performed easily. The results are shown in Table 2.

Example 3

As with Example 1, high purity Ni-5 wt % Pt alloy was prepared. The hardness of this alloy was Hv 55. This alloy was rolled at room temperature to obtain a target. There were no generation of cracks or fractures in the target, and rolling could be performed easily. The results are shown in Table 2.

Example 4

As with Example 1, high purity Ni-10 wt % Pt alloy was prepared. The hardness of this alloy was Hv 65. This alloy was rolled at room temperature to obtain a target. There were no generation of cracks or fractures in the target, and rolling could be performed easily. The results are shown in Table 2.

TABLE 2

| (units are wtppm) | | | |
|---|---|---|---|
| | Example 2 | Example 3 | Example 4 |
| Fe | 2.0 | 1.9 | 1.8 |
| Cr | 0.6 | 0.6 | 0.6 |
| Co | 0.5 | 0.5 | 0.5 |
| Cu | 0.1 | 0.1 | 0.1 |
| Al | 0.1 | 0.1 | 0.1 |
| O | 20 | 20 | 20 |
| C | 10 | 10 | 10 |
| N | <10 | <10 | <10 |
| Hardness | 45 | 55 | 65 |
| Plastic Workability at Room Temperature | Excellent | Excellent | Excellent |

Comparative Example 1

Pt having the same purity as 3N level Ni was dissolved to become Ni-20 wt %. As a result, the hardness of the obtained ingot was Hv 110. This ingot was extremely hard, and plastic working at room temperature was difficult. The results are shown in Table 1 in comparison to Example 1.

As described above, the present invention yields a superior effect in that it is easy to perform cold rolling to a dissolved Ni—Pt alloy ingot, and is capable of simultaneously reducing the impurities contained in the Ni—Pt alloy target to realize high purification. As a result, it is possible to improve the quality of Ni—Pt alloy deposition.

Further, in addition to being able to prevent the generation of fractures and cracks in the target, a significant effect is yielded in that the generation of particles resulting from the abnormal electrical discharge of sputtering can be inhibited. Therefore, this is suitable for the deposition of Ni—Pt alloy in a semiconductor device.

I claim:

1. A method of manufacturing a Ni—Pt alloy superior in workability, comprising the steps of:

subjecting a raw material Ni having a purity of 3N level to electrolytical dissolution to obtain a solution containing Ni;

neutralizing the solution containing Ni with ammonia to obtain a neutralized solution;

removing impurities by filtering the neutralized solution with activated carbon to obtain a filtered solution;

blowing carbon dioxide into the filtered solution to form nickel carbonate;

exposing the nickel carbonate to a reducing atmosphere to prepare high purity Ni powder;

dissolving a raw material Pt having a purity of 3N level into acid to obtain a solution containing Pt;

subjecting the solution containing Pt to electrolysis to prepare high purity electrodeposited Pt; and melting the high purity Ni powder together with the high purity electrodeposited Pt to obtain the Ni-Pt alloy.

2. A method according to claim 1, wherein the Ni—Pt alloy has a purity of 99.99% or higher.

3. A method according to claim 2, wherein the Ni—Pt alloy has Pt in a content of 0.1 to 20 wt % and has a Vickers hardness of 40 to 90.

4. A method according to claim 3, further comprising the step of manufacturing a Ni—Pt alloy sputtering target from the high purity Ni powder and high purity electrodeposited Pt after said melting step.

5. A method according to claim 1, wherein the Ni—Pt alloy has Pt in a content of 0.1 to 20 wt % and has a Vickers hardness of 40 to 90.

6. A method according to claim 5, further comprising the step of manufacturing a Ni—Pt alloy sputtering target from the high purity Ni powder and high purity electrodeposited Pt after said melting step.

7. A method according to claim 1, further comprising the step of manufacturing a Ni—Pt alloy sputtering target from the high purity Ni powder and high purity electrodeposited Pt after said melting step.

* * * * *